(12) United States Patent
Hou (10) Patent No.: US 11,825,699 B2
(45) Date of Patent: Nov. 21, 2023

(54) OLED WITH A SHAPE MEMORY ALLOY BOTTOM ELECTRODE, METHOD FOR MANUFACTURING THE SAME, AND DISPLAY APPARATUS INCLUDING THE OLED

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 383 days.

(21) Appl. No.: 17/267,082

(22) PCT Filed: May 20, 2020

(86) PCT No.: PCT/CN2020/091282
§ 371 (c)(1),
(2) Date: Feb. 9, 2021

(87) PCT Pub. No.: WO2020/233596
PCT Pub. Date: Nov. 26, 2020

(65) Prior Publication Data
US 2021/0313406 A1 Oct. 7, 2021

(30) Foreign Application Priority Data
May 23, 2019 (CN) .......................... 201910437386.5

(51) Int. Cl.
*H01L 27/32* (2006.01)
*H01L 51/50* (2006.01)
(Continued)

(52) U.S. Cl.
CPC ........... *H10K 59/122* (2023.02); *H10K 50/15* (2023.02); *H10K 50/16* (2023.02); *H10K 50/171* (2023.02); *H10K 71/00* (2023.02)

(58) Field of Classification Search
CPC .................................................. H10K 59/122
See application file for complete search history.

(56) References Cited

U.S. PATENT DOCUMENTS 10,038,039 B2  7/2018 Choi et al.
2007/0241690 A1  10/2007 Smith
(Continued)

FOREIGN PATENT DOCUMENTS

CN  101543135 A  9/2009
CN  103839963 A  6/2014
(Continued)

OTHER PUBLICATIONS

China Patent Office, First Office Action dated Dec. 15, 2020, for corresponding Chinese application 201910437386.5.
(Continued)

*Primary Examiner* — Peter Bradford
(74) *Attorney, Agent, or Firm* — HOUTTEMAN LAW LLC (57) ABSTRACT

There is provided an organic light-emitting diode including: a pixel defining layer on a substrate and having a plurality of openings for defining pixel regions, wherein each pixel region is a region including one pixel therein; a plurality of first pixel electrodes on the substrate and in the plurality of openings, respectively, each first pixel electrode being at a peripheral portion of a corresponding opening adjacent to the pixel defining layer; and a plurality of second pixel electrodes on the substrate and in the plurality of openings, respectively, each second pixel electrode being at a central portion of the corresponding opening. Each first pixel electrode is between the pixel defining layer and a corresponding second pixel electrode, and the plurality of first pixel elec-
(Continued)

trodes and the plurality of second pixel electrodes are in a same layer. Each first pixel electrode includes a shape memory alloy material.

20 Claims, 5 Drawing Sheets (51) Int. Cl.
*H01L 51/56* (2006.01)
*H10K 59/122* (2023.01)
*H10K 50/15* (2023.01)
*H10K 50/16* (2023.01)
*H10K 50/17* (2023.01)
*H10K 71/00* (2023.01)

(56) References Cited

U.S. PATENT DOCUMENTS

| | | |
|---|---|---|
| 2009/0001361 A1 | 1/2009 | Shiba et al. |
| 2009/0224664 A1 | 9/2009 | Yoshida et al. |
| 2010/0079398 A1* | 4/2010 | Shen ................ G06F 3/04144 345/173 |
| 2012/0190144 A1 | 7/2012 | Kang et al. |
| 2016/0365531 A1 | 12/2016 | Hu et al. |
| 2017/0194395 A1 | 7/2017 | Hu et al. |
| 2018/0062091 A1* | 3/2018 | Furuie ..................... B32B 7/06 |
| 2018/0254306 A1 | 9/2018 | Matsueda |
| 2019/0131373 A1 | 5/2019 | Sun |

FOREIGN PATENT DOCUMENTS

| | | | | |
|---|---|---|---|---|
| CN | 104465708 A | | 3/2015 | |
| CN | 105448957 A | | 3/2016 | |
| CN | 105655376 A | | 6/2016 | |
| CN | 107591434 A | | 1/2018 | |
| CN | 107731879 A | | 2/2018 | |
| CN | 108346677 A | | 7/2018 | |
| CN | 109256413 A | * | 1/2019 | ......... H01L 27/3276 |
| CN | 208819915 U | * | 5/2019 | |
| CN | 208819915 U | | 5/2019 | |
| CN | 110164931 A | | 8/2019 | |
| JP | 5111949 A | | 1/2013 | |

OTHER PUBLICATIONS

Yangming Lin, "Control of film morphology in the process of inkjet printing organic light-emitting diodes", Changchun University of Science and Technology, Apr. 2018.

Ting Dong, "Inkjet printing technology to prepare PLED display screen and related research," South China University of Technology, Apr. 2016.

* cited by examiner

OLED WITH A SHAPE MEMORY ALLOY BOTTOM ELECTRODE, METHOD FOR MANUFACTURING THE SAME, AND DISPLAY APPARATUS INCLUDING THE OLED

CROSS-REFERENCE TO RELATED APPLICATIONS

This is a National Phase Application filed under 35 U.S.C. 371 as a national stage of PCT/CN2020/091282 filed on May 20, 2020, and application claiming the priority of Chinese patent application No. 201910437386.5 filed on May 23, 2019, the content of each of which is incorporated herein by reference in its entirety.

TECHNICAL FIELD

The present disclosure relates generally to the field of display technologies, and in particular, to an organic light-emitting diode, a method for manufacturing the same, and a display apparatus.

BACKGROUND

Generally, an organic electroluminescent device (which is also referred to as an organic light-emitting diode (OLED)) may be manufactured by a thin film deposition method, which mainly includes a vacuum evaporation method and a solution processing method.

SUMMARY

According to an aspect of the present invention, there is provided an organic light-emitting diode, including: a pixel defining layer on a substrate and having a plurality of openings for defining pixel regions, wherein each of the pixel regions is a region including one pixel therein; a plurality of first pixel electrodes on the substrate and in the plurality of openings, respectively, each of the plurality of first pixel electrodes being at a peripheral portion of a corresponding opening adjacent to the pixel defining layer; and a plurality of second pixel electrodes on the substrate and in the plurality of openings, respectively, each of the plurality of second pixel electrodes being at a central portion of the corresponding opening, wherein each of the plurality of first pixel electrodes is between the pixel defining layer and a corresponding one of the plurality of second pixel electrodes, and the plurality of first pixel electrodes and the plurality of second pixel electrodes are in a same layer, and wherein each of the plurality of first pixel electrodes includes a shape memory alloy material.

In some embodiments, the shape memory alloy material has a property of forming a protrusion at a temperature at which a drying process of ink-jet printing is performed.

In some embodiments, the shape memory alloy material includes at least one of an iron-nickel alloy material and a titanium-nickel alloy material.

In some embodiments, the organic light-emitting diode further includes: an organic functional layer in each of the plurality of openings and on the first and second pixel electrodes.

In some embodiments, the organic functional layer includes a hole injection layer, a hole transport layer, an organic light-emitting layer, an electron transport layer, and an electron injection layer.

According to another aspect of the present disclosure, there is provided a method for manufacturing an organic light-emitting diode, including: forming a second pixel electrode layer on a substrate; forming a first photoresist layer on the second pixel electrode layer and patterning the first photoresist layer to form a patterned first photoresist layer; patterning the second pixel electrode layer to obtain a second pixel electrode; forming a first pixel electrode layer covering the patterned first photoresist layer and the second pixel electrode on the substrate; forming a second photoresist layer on the first pixel electrode layer and patterning the second photoresist layer; removing a portion of the first pixel electrode layer exposed by a patterned second photoresist layer to obtain a first pixel electrode that surrounds the second pixel electrode; removing the patterned first photoresist layer and the patterned second photoresist layer; and forming a pixel defining layer on a portion, on which the first and second pixel electrodes are not formed, of the substrate in a pixel region, wherein in a direction perpendicular to the substrate, the pixel defining layer has a thickness greater than each of a thickness of the first pixel electrode and a thickness of the second pixel electrode, such that the pixel defining layer forms an opening accommodating the first and second pixel electrodes, wherein the first pixel electrode includes a shape memory alloy material.

In some embodiments, the method further includes: forming an organic functional layer covering the first and second pixel electrodes in the opening.

In some embodiments, the forming an organic functional layer includes: an ink jet printing process and a drying process, wherein the first pixel electrode protrudes to have a first shape different from an original shape of the first pixel electrode during the drying process, such that a portion of ink of the organic functional layer at the first pixel electrode flows toward the second pixel electrode.

In some embodiments, the first shape of the first pixel electrode is restored to the original shape when the ink jet printing process and the drying process are finished.

In some embodiments, the shape memory alloy material is selected from at least one of an iron-nickel alloy material and a titanium-nickel alloy material.

In some embodiments, the forming an organic functional layer includes: forming a hole injection layer, a hole transport layer, an organic light-emitting layer, an electron transport layer, and an electron injection layer in sequence.

In some embodiments, the patterning the first photoresist layer includes: exposing and developing the first photoresist layer.

In some embodiments, the patterning the second photoresist layer includes: exposing and developing the second photoresist layer.

According to still another aspect of the present disclosure, there is provided a display apparatus, which includes the organic light-emitting diode according to any one of the foregoing embodiments of the present disclosure.

BRIEF DESCRIPTION OF THE DRAWINGS

Other features, objects and advantages of the present disclosure will become more apparent upon reading the detailed description of non-limiting embodiments made with reference to the accompanying drawings, in which.

DETAILED DESCRIPTION

The present disclosure will be described in further detail below with reference to the drawings and exemplary embodiments. It is to be understood that the exemplary embodiments described herein are for purposes of explanation only and are not for limiting the present disclosure. It should be further noted that, for convenience of description, only the components relevant to the present disclosure are shown in the drawings.

It should be noted that, in the present disclosure, the embodiments and features of the embodiments may be combined with each other in a case where there is no explicit conflict. The present disclosure is now described in detail below with reference to the drawings in conjunction with exemplary embodiments.

Unless defined otherwise, technical or scientific terms used herein shall have the ordinary meaning as understood by one of ordinary skill in the art to which the present disclosure belongs. The use of word such as "first", "second" or the like in the present disclosure is not intended to indicate any order, quantity, or importance, but rather is used for distinguishing one element from another. The word such as "comprising", "including" or the like, means that an element or item preceding the word contains an element or item listed after the word and an equivalent thereof, but does not exclude other elements or items. The word such as "connected", "coupled" or the like is not limited to physical or mechanical connections, but may include electrical connections, including direct or indirect connections. The words such as "upper", "lower", "left", "right", and the like are used only for indicating relative positional relationships, and when an absolute position of the object being described is changed, the relative positional relationships may also be changed accordingly.

Compared with a liquid crystal display, an organic light-emitting diode display has the advantages of self luminescence, fast response, wide viewing angle, high brightness, bright color, being thin and light, and the like. A method for manufacturing a light-emitting layer and its auxiliary layers (such as a hole injection layer, a hole transport layer, an electron injection layer, an electron transport layer, etc.) of the organic light-emitting diode mainly includes two processes (or methods) that are vacuum evaporation and solution processing. The vacuum evaporation method is suitable for film formation of an organic small molecular material, and has the advantages of good film formation uniformity and being a relatively mature technology. However, for the vacuum evaporation, a film formation apparatus needs a large investment, a material utilization rate is low, and an alignment accuracy is low in a case of a large-sized product. The solution processing method includes methods such as spin coating, ink-jet printing and nozzle coating, is suitable for film formation of a polymer material and a soluble small molecule, has the advantage of low equipment cost and prominent advantages in large-scaled production and large-sized products, and has such advantages particularly in an ink jet printing technology. Processes for forming an organic material layer by ink-jet printing may include an ink-jet printing process and a drying process. The ink-jet printing process is for printing ink inside an opening formed in a pixel defining layer. The drying process is for evaporating a solvent in the ink by controlling a pressure, a temperature, a time period, etc. for the solvent evaporation, and thus forming a thin film in the opening.

The inventors of the present disclosure have found that, when an organic thin film electroluminescent device is formed by an ink jet printing process, during a process of forming a film in a pixel, ink may climb onto a pixel defining layer (e.g., due to a surface tension) such that a thickness of an organic functional layer at an edge portion of the pixel is greater than a thickness of the organic functional layer at a central portion of the pixel, which results in that in a display apparatus, a brightness of a pixel unit at a central portion of the pixel unit is high whereas a brightness of the pixel unit at a periphery (i.e., an edge portion) of the pixel unit is low, resulting in nonuniform light emission of the pixel unit.

Figure 1:
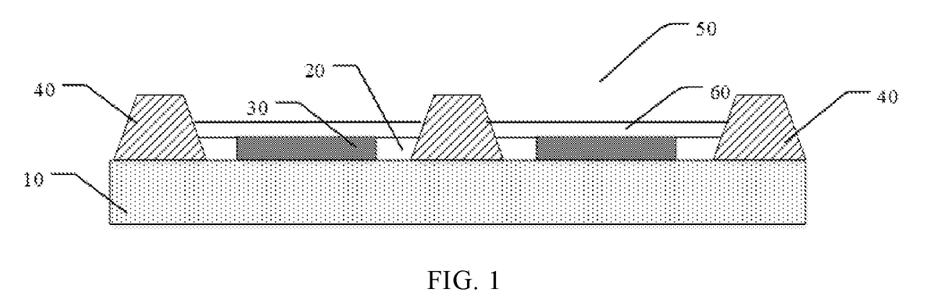
FIG. 1 shows an exemplary cross-sectional view of an organic light-emitting diode according to an embodiment of the present disclosure.
Figure 2:
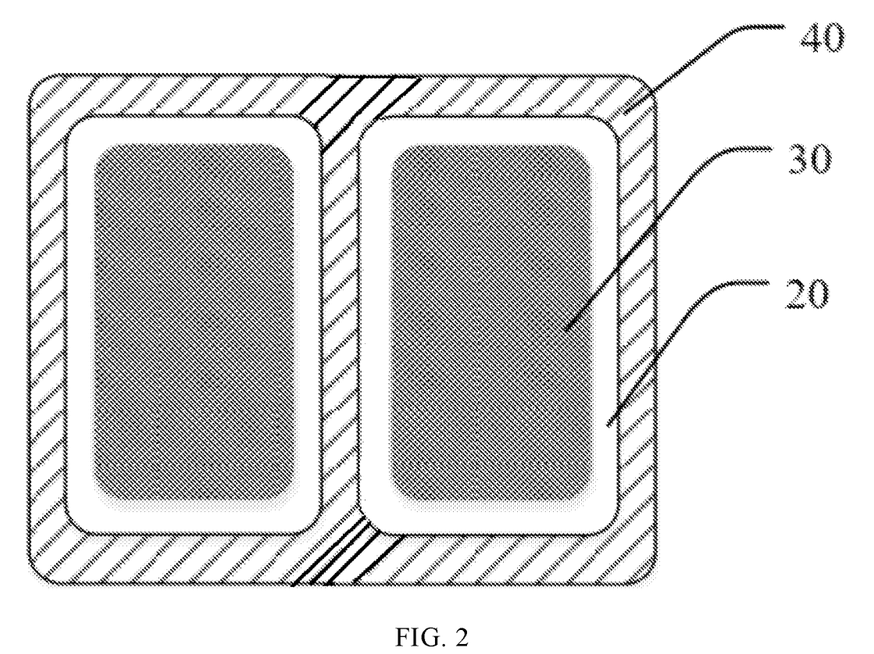
FIG. 2 shows an exemplary top view of an organic light-emitting diode according to an embodiment of the present disclosure.

An embodiment of the present disclosure provides an organic light-emitting diode, as shown in FIG. 1. The organic light-emitting diode may include a substrate 10, a pixel defining layer 40 having a plurality of openings 50 for defining a plurality of pixel regions, a plurality of first pixel electrodes 20, and a plurality of second pixel electrodes 30. The plurality of first pixel electrodes 20 may be in one-to-one correspondence with the plurality of second pixel electrodes 30. The plurality of first pixel electrodes 20 may be in one-to-one correspondence with the plurality of openings 50. The plurality of second pixel electrodes 30 may be in one-to-one correspondence with the plurality of openings 50. Each first pixel electrode 20 and the corresponding second pixel electrode 30 are disposed in a same layer in one of the openings 50. Each first pixel electrode 20 surrounds (e.g., completely surrounds, as shown in FIG. 2) the corresponding second pixel electrode 30, and is adjacent to the pixel defining layer 40. Each first pixel electrode 20 includes a shape memory alloy material. For example, each of the pixel regions is a region including one pixel therein.

The pixel defining layer is used for defining the plurality of openings which are arranged in a matrix (or in an array). For example, FIG. 1 shows the openings in a 1×2 matrix, but this is merely exemplary, and one of ordinary skill in the art will appreciate that the number of the plurality of openings may be greater than 2 and that the plurality of openings may be arranged in any suitable matrix.

A portion of the pixel defining layer 40 defining each opening 50 has a plurality of wall surfaces proximal to the opening. In general, in a case where an ink-jet printing process is used for forming an organic functional layer of the organic light-emitting diode, ink will climb onto these wall surfaces such that a thickness of the organic functional layer in a peripheral portion of the opening (i.e., a thickness of the organic functional layer adjacent to the pixel defining layer) is greater than a thickness of the organic functional layers in a central portion of the opening. This results in that in a display panel, a brightness of each opening at the central portion of the opening is higher than a brightness of the opening at the peripheral portion of the opening, resulting in nonuniform light emission of a pixel unit.

To solve the problem of nonuniform light emission caused by the nonuniform thicknesses of the organic functional layer of the organic thin film electroluminescent device, the present embodiment provides an organic electroluminescent device (which is also referred to as an organic light-emitting diode) in which a first pixel electrode 20 and a second pixel electrode 30 are disposed in a same layer in each of the openings 50 in the pixel defining layer 40, and the first pixel electrode 20 includes a shape memory alloy material. A manner in which an organic functional layer with a uniform thickness is formed may be referred to a manufacturing method to be described later.

It should be noted that, the expression of being in a same layer herein may mean that a bottom surface of each first pixel electrode 20 and a bottom surface of the corresponding second pixel electrode 30 have a same distance from the substrate.

Further, the shape memory alloy material has a property of being able to form a protrusion at a temperature (e.g., a high temperature) for a drying process of ink-jet printing. In a subsequent drying process (to be described later) for forming an organic functional layer, each of the first pixel electrodes 20 may protrude such that a portion of the ink of the organic functional layer at the first pixel electrode 20 flows toward the corresponding second pixel electrode 30. That is, each first pixel electrode 20 is adjacent to the pixel defining layer 40 (as shown in FIG. 2), and the protrusion formed by the first pixel electrode 20 can reduce the amount of ink around the pixel defining layer 40, such that a uniform organic functional layer can be formed.

Further, the shape memory alloy material of each of the first pixel electrodes 20 may be an iron-nickel alloy material or a titanium-nickel alloy material. A material of each of the second pixel electrodes 30 may include AZO (aluminum-doped zinc oxide), IZO (indium zinc oxide), ITO (indium tin oxide), ZnO (zinc oxide), or the like. It should be noted that a content of each component of the shape memory alloy material is not limited herein, and may be set by one of ordinary skill in the art according to an actual requirement. In addition, a width of each of the first pixel electrodes is not limited herein, and may be set by one of ordinary skill in the art according to an actual requirement.

Further, an organic functional layer 60 is disposed on the first pixel electrode 20 and the second pixel electrode 30 in each of the openings 50. The organic functional layer 60 may include a hole injection layer, a hole transport layer, an organic light-emitting layer, an electron transport layer, and an electron injection layer (which are not shown) sequentially disposed on the first pixel electrode 20 and the second pixel electrode 30. In this case, the first pixel electrode 20 and/or the second pixel electrode 30 may be an anode of the organic light-emitting diode (OLED). Furthermore, the organic light-emitting diode (OLED) may further include a conventional cathode on the electron injection layer, as is readily understood by one of ordinary skill in the art.

Figure 3:
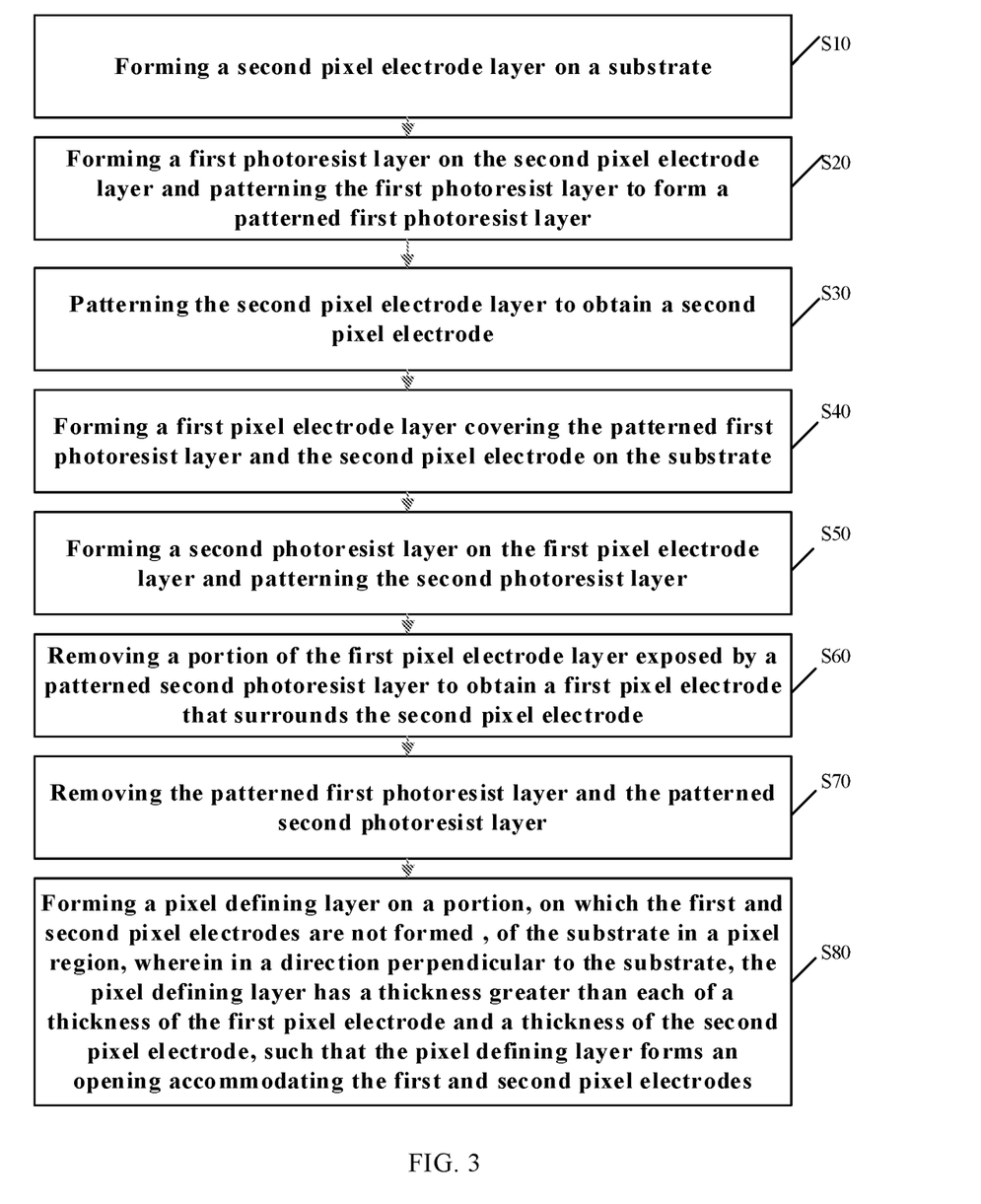
FIG. 3 shows an exemplary flowchart of a method for manufacturing an organic light-emitting diode according to an embodiment of the present disclosure.

As shown in FIG. 3, an embodiment of the present disclosure provides a method for manufacturing an organic light-emitting diode. The method may include the following steps S10 to S90.

In step S10, a second pixel electrode layer is formed (e.g., deposited) on the substrate.

In step S20, a first photoresist layer is formed on the second pixel electrode layer and is patterned to form a patterned first photoresist layer, for example, by exposing and developing the first photoresist layer to form a desired patterned first photoresist layer.

In step S30, the second pixel electrode layer is patterned to obtain a second pixel electrode. For example, an exposed portion of the second pixel electrode layer is etched and a portion of the second pixel electrode layer covered by the patterned first photoresist layer is maintained to obtain the second pixel electrode.

In step S40, a first pixel electrode layer, which covers the patterned first photoresist layer and the second pixel electrode, is formed on the substrate. For example, the first pixel electrode layer is deposited on the substrate.

In step S50, a second photoresist layer is formed on the first pixel electrode layer and patterned, for example, by exposing and developing the second photoresist layer, to form a desired patterned second photoresist layer.

In step S60, a portion of the first pixel electrode layer exposed by the patterned second photoresist layer is removed and a portion of the first pixel electrode layer covered by the patterned second photoresist layer is maintained to obtain a first pixel electrode. For example, the portion of the first pixel electrode layer exposed by the patterned second photoresist layer may be etched. In this process, a portion of the first pixel electrode layer may remain between the patterned second photoresist layer and the patterned first photoresist layer, but it will be understood by one of ordinary skill in the art that the remaining portion of the first pixel electrode layer is negligible because it is very small in size. Alternatively, one of ordinary skill in the art may also employ any suitable process (e.g., drill etching or dot etching) to remove the portion of the first pixel electrode layer remaining between the patterned second photoresist layer and the patterned first photoresist layer, such that an upper surface of the formed first pixel electrode is flush with an upper surface of the second pixel electrode. In each of the openings, the first pixel electrode surrounds (e.g., completely surrounds) the second pixel electrode.

In step S70, the patterned first photoresist layer and the patterned second photoresist layer are removed. For example, the patterned first photoresist layer and the patterned second photoresist layer are stripped (or peeled) off.

In step S80, a pixel defining layer is formed on a portion, on which the first pixel electrode and the second pixel electrode are not formed, of the substrate in a pixel region. For example, in a direction perpendicular to the substrate, a thickness of the pixel defining layer is greater than a thickness of each first pixel electrode or a thickness of each second pixel electrode, such that the pixel defining layer forms an opening that accommodates (or houses) one first pixel electrode and the corresponding second pixel electrode.

In step S90, an organic functional layer, which covers the first pixel electrode and the second pixel electrode, is formed in each opening. For example, the organic functional layer is formed by performing an ink jet printing process in the opening and performing a drying process on the ink at a high temperature, and the first pixel electrode protrudes during the drying process, such that a portion of the ink of the organic functional layer at the first pixel electrode flows toward the corresponding second pixel electrode, and a protruded shape of the first pixel electrode is restored to an original shape of the first pixel electrode after the ink jet printing process and the drying process are finished.

The manufacturing steps will be further described below with reference to FIGS. 4 to 12.

Figure 4:
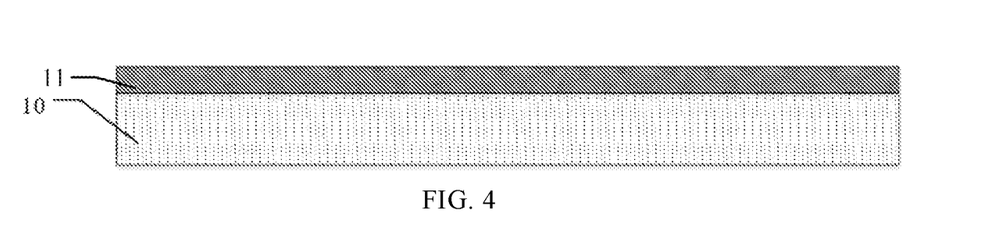
FIGS. 4 to 12 are schematic diagrams illustrating structures formed by respective steps of a method for manufacturing an organic light-emitting diode according to an embodiment of the present disclosure.

As shown in FIG. 4, a second pixel electrode layer 11 is formed (e.g., deposited) on the substrate 10.

Figure 5:
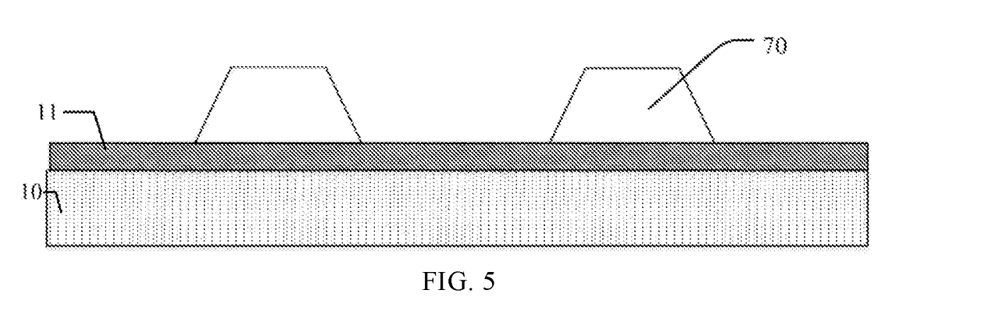

As shown in FIG. 5, a first photoresist layer (not shown) is formed on the second pixel electrode layer 11 as shown in FIG. 4 and patterned to form a patterned first photoresist layer 70. For example, the first photoresist layer is patterned by exposing and developing the first photoresist layer, to form the desired patterned first photoresist layer 70.

Figure 6:
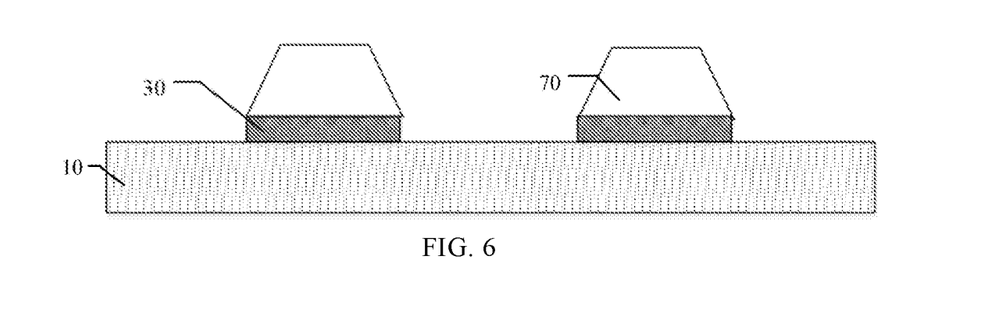

As shown in FIG. 6, the second pixel electrode layer 11 is patterned to obtain the second pixel electrode 30. For example, an exposed portion of the second pixel electrode layer 11 is etched and a portion of the second pixel electrode layer 11 covered by the patterned first photoresist layer 70 is remained to obtain the second pixel electrode 30.

Figure 7:
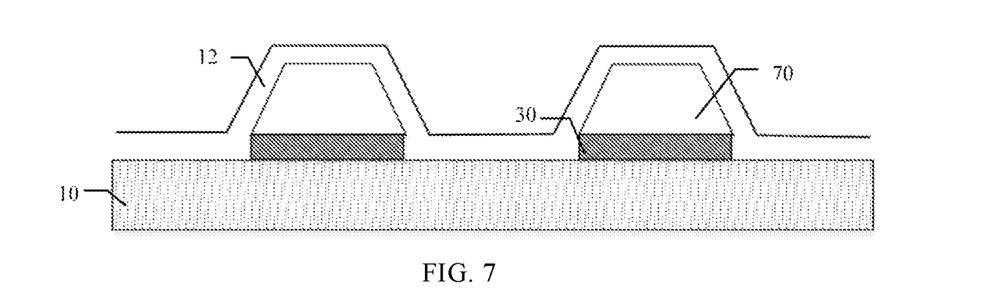

As shown in FIG. 7, a first pixel electrode layer 12 covering the patterned first photoresist layer 70 and the second pixel electrode 30 is formed on the substrate shown in FIG. 6. For example, the first pixel electrode layer 12 is deposited on the substrate 1.

Figure 8:
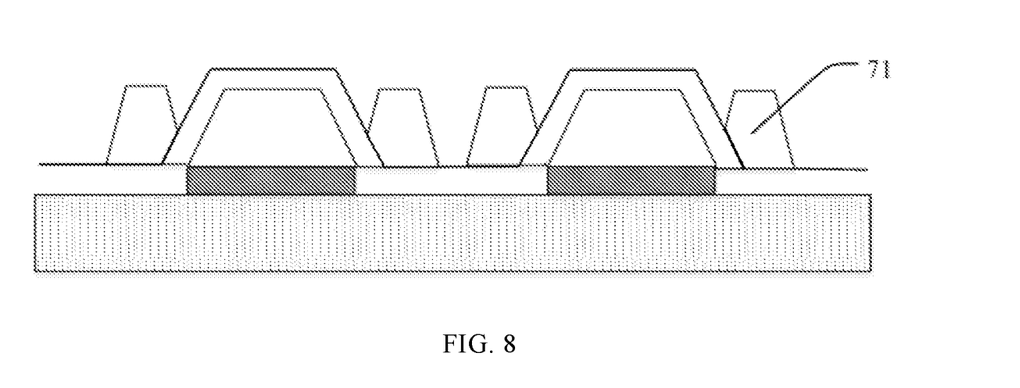

As shown in FIG. 8, a second photoresist layer (not shown) is formed on the first pixel electrode layer 12 and is patterned, for example, by exposing and developing the second photoresist layer, to form a desired patterned second photoresist layer 71.

Figure 9:
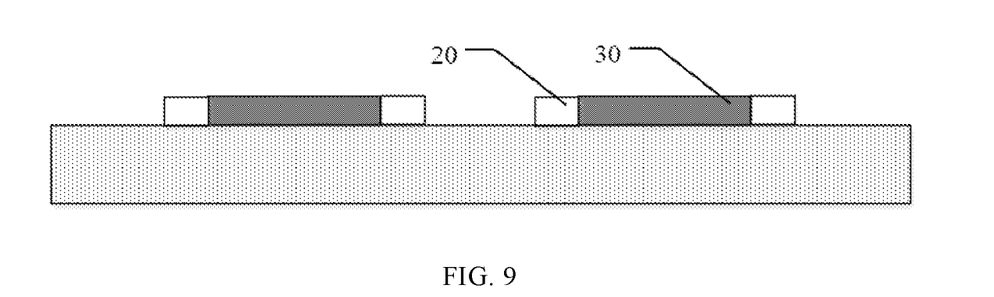

As shown in FIG. 9, a portion of the first pixel electrode layer 12 exposed by the patterned second photoresist layer 71 is removed and a portion of the first pixel electrode layer 12 covered by the partially patterned second photoresist layer 71 is remained to obtain the first pixel electrode 20. For example, the portion of the first pixel electrode layer 12 exposed by the patterned second photoresist layer 71 is etched, during which a portion of the first pixel electrode layer may be remained between the patterned second photoresist layer and the patterned first photoresist layer. In this case, it will be understood by one of ordinary skill in the art that the remaining portion of the first pixel electrode layer may be negligible because it is very small in size. Alternatively, one of ordinary skill in the art may adopt any suitable process (e.g., drill etching or dot etching) to remove the portion of the first pixel electrode layer remaining between the patterned second photoresist layer and the patterned first photoresist layer, such that the upper surface of each formed first pixel electrode 20 is flush with the upper surface of the corresponding second pixel electrode 30.

Figure 10:
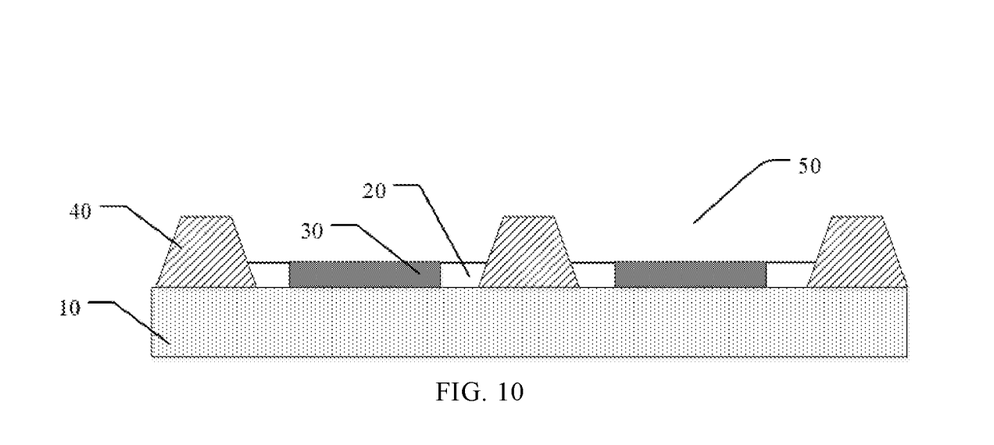

As shown in FIG. 10, after removing the patterned first photoresist layer 70 and the patterned second photoresist layer 71, a pixel defining layer 40 is formed on a portion, on which the first pixel electrode 20 and the second pixel electrode 30 are not formed, of the substrate in each pixel region. For example, in a direction perpendicular to the substrate 10, a thickness of the pixel defining layer 40 is greater than a thickness of the first pixel electrode 20 or a thickness of the second pixel electrode 30, such that the pixel defining layer 40 forms an opening 50 that accommodates (or houses) the first pixel electrode 20 and the second pixel electrode 30.

Figure 11:
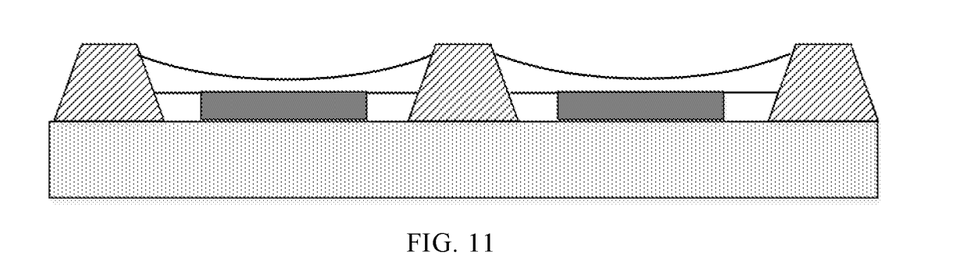

As shown in FIG. 11, an organic functional layer is formed in each opening 50 by an ink-jet printing process, during which ink climbs onto the wall surfaces of the pixel defining layer 40, such that a thickness of the ink in the peripheral portion of the opening is greater than a thickness of the ink in the central portion of the opening.

Figure 12:
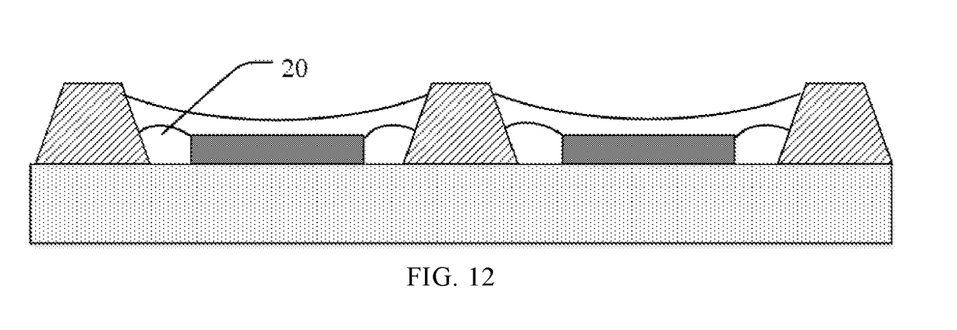

As shown in FIG. 12, a drying process is performed on the ink in the opening 50, and the first pixel electrode 20 protrudes at a temperature (e.g., a high temperature) at which the drying process is performed, such that a portion of the ink of the organic functional layer at the first pixel electrode 20 flows toward the corresponding second pixel electrode 30. The organic functional layer is generally formed by ink-jet printing a hole injection layer, a hole transport layer, an organic light-emitting layer, an electron transport layer, and an electron injection layer in sequence in each of the openings 50. Each of the hole injection layer, the hole transport layer, the organic light-emitting layer, the electron transport layer and the electron injection layer may be subjected to an ink jet printing process and a drying process, and then, the hole injection layer, the hole transport layer, the organic light-emitting layer, the electron transport layer and the electron injection layer are formed as a laminated organic functional layer.

At the end of the drying process, each first pixel electrode 20 returns to its original shape, and an organic functional layer having a uniform thickness is formed, such that the organic light-emitting diode as shown in FIG. 1 is obtained.

An embodiment of the present disclosure provides a display apparatus, which includes the organic light-emitting diode provided by any one of the foregoing embodiments of the present disclosure. Further, the display apparatus may include a conventional touch panel which is arranged on a light-emitting surface of the organic light-emitting diode.

In the organic light-emitting diode, the manufacturing method thereof and the display apparatus provided by the foregoing embodiments of the present disclosure, the first pixel electrode and the second pixel electrode are arranged in a same layer in each of the openings of the pixel defining layer, and the first pixel electrode is made of the shape memory alloy material. As such, at least the problem of nonuniform thicknesses of an organic functional layer of the related organic thin film electroluminescent device can be solved, thereby improving the light-emitting uniformity of each pixel of the organic light-emitting diode and the display apparatus.

The foregoing description is only exemplary embodiments of the present disclosure and is for explaining the principle of the technology employed. It will be appreciated by one of ordinary skill in the art that the scope of the present disclosure is not limited to technical solutions formed by the specific combination of the above-mentioned technical features, but also covers other technical solutions formed by arbitrarily combinations of the above-mentioned technical features or their equivalents without departing from the technical concept of the present disclosure. For example, the scope of the present disclosure covers a technical solution formed by interchanging each of the above features and a technical feature, which has similar functions, disclosed in (but not limited to being disclosed in) the present disclosure.

What is claimed is:

1. An organic light-emitting diode, comprising:
    a pixel defining layer on a substrate and having a plurality of openings for defining pixel regions, wherein each of the pixel regions is a region comprising one pixel therein;
    a plurality of first pixel electrodes on the substrate and in the plurality of openings, respectively, each of the plurality of first pixel electrodes being at a peripheral portion of a corresponding opening adjacent to the pixel defining layer; and
    a plurality of second pixel electrodes on the substrate and in the plurality of openings, respectively, each of the plurality of second pixel electrodes being at a central portion of the corresponding opening,
    wherein each of the plurality of first pixel electrodes is between the pixel defining layer and a corresponding one of the plurality of second pixel electrodes, and the plurality of first pixel electrodes and the plurality of second pixel electrodes are in a same layer, and
    wherein each of the plurality of first pixel electrodes comprises a shape memory alloy material.

2. The organic light-emitting diode according to claim 1, wherein the shape memory alloy material is configured to form a protrusion during a drying process of ink-jet printing.

3. The organic light-emitting diode according to claim 1, wherein the shape memory alloy material comprises at least one of an iron-nickel alloy material and a titanium-nickel alloy material.

4. The organic light-emitting diode according to claim 1, further comprising:
an organic functional layer in each of the plurality of openings and on the first and second pixel electrodes.

5. The organic light-emitting diode according to claim 4, wherein the organic functional layer comprises a hole injection layer, a hole transport layer, an organic light-emitting layer, an electron transport layer, and an electron injection layer.

6. A method for manufacturing an organic light-emitting diode, comprising:
forming a second pixel electrode layer on a substrate;
forming a first photoresist layer on the second pixel electrode layer and patterning the first photoresist layer to form a patterned first photoresist layer;
patterning the second pixel electrode layer to obtain a second pixel electrode;
forming a first pixel electrode layer covering the patterned first photoresist layer and the second pixel electrode on the substrate;
forming a second photoresist layer on the first pixel electrode layer and patterning the second photoresist layer;
removing a portion of the first pixel electrode layer exposed by a patterned second photoresist layer to obtain a first pixel electrode that surrounds the second pixel electrode;
removing the patterned first photoresist layer and the patterned second photoresist layer; and
forming a pixel defining layer on a portion, on which the first and second pixel electrodes are not formed, of the substrate in a pixel region, wherein in a direction perpendicular to the substrate, the pixel defining layer has a thickness greater than each of a thickness of the first pixel electrode and a thickness of the second pixel electrode, such that the pixel defining layer forms an opening accommodating the first and second pixel electrodes,
wherein the first pixel electrode comprises a shape memory alloy material.

7. The method according to claim 6, further comprising:
forming an organic functional layer covering the first and second pixel electrodes in the opening.

8. The method according to claim 7, wherein the forming an organic functional layer comprises: an ink-jet printing process and a drying process, wherein the first pixel electrode protrudes to have a first shape different from an original shape of the first pixel electrode during the drying process, such that a portion of ink of the organic functional layer at the first pixel electrode flows toward the second pixel electrode.

9. The method according to claim 8, wherein the first shape of the first pixel electrode is restored to the original shape when the ink-jet printing process and the drying process are finished.

10. The method according to claim 6, wherein the shape memory alloy material is selected from at least one of an iron-nickel alloy material and a titanium-nickel alloy material.

11. The method according to claim 7, wherein the forming an organic functional layer comprises: forming a hole injection layer, a hole transport layer, an organic light-emitting layer, an electron transport layer, and an electron injection layer in sequence.

12. The method according to claim 6, wherein the patterning the first photoresist layer comprises:
exposing and developing the first photoresist layer.

13. The method according to claim 6, wherein the patterning the second photoresist layer comprises:
exposing and developing the second photoresist layer.

14. A display apparatus, comprising the organic light-emitting diode according to claim 1.

15. The organic light-emitting diode according to claim 2, wherein the shape memory alloy material comprises at least one of an iron-nickel alloy material and a titanium-nickel alloy material.

16. The organic light-emitting diode according to claim 2, further comprising:
an organic functional layer in each of the plurality of openings and on the first and second pixel electrodes.

17. The organic light-emitting diode according to claim 3, further comprising:
an organic functional layer in each of the plurality of openings and on the first and second pixel electrodes.

18. The organic light-emitting diode according to claim 15, further comprising:
an organic functional layer in each of the plurality of openings and on the first and second pixel electrodes.

19. The organic light-emitting diode according to claim 16, wherein the organic functional layer comprises a hole injection layer, a hole transport layer, an organic light-emitting layer, an electron transport layer, and an electron injection layer.

20. The organic light-emitting diode according to claim 17, wherein the organic functional layer comprises a hole injection layer, a hole transport layer, an organic light-emitting layer, an electron transport layer, and an electron injection layer.

* * * * *